(12) United States Patent
Pernu et al.

(10) Patent No.: US 11,767,218 B2
(45) Date of Patent: Sep. 26, 2023

(54) MICROELECTROMECHANICAL CAPACITIVE PRESSURE SENSOR HAVING A VALVE PORTION BEING OPERABLE TO CLOSE FIRST OUTPUT AND OPEN SECOND OUTPUT TO EQUALIZE PRESSURE

(71) Applicant: Teknologian tutkimuskeskus VTT Oy, Espoo (FI)

(72) Inventors: Tapio Pernu, Espoo (FI); Jukka Kyynäräinen, Espoo (FI); Jaakko Saarilahti, Espoo (FI)

(73) Assignee: Teknologian tutkimuskeskus VTT Oy, Espoo (FI)

( * ) Notice: Subject to any disclaimer, the term of this patent is extended or adjusted under 35 U.S.C. 154(b) by 307 days.

(21) Appl. No.: 17/274,817

(22) PCT Filed: Sep. 12, 2019

(86) PCT No.: PCT/FI2019/050654
§ 371 (c)(1),
(2) Date: Mar. 10, 2021

(87) PCT Pub. No.: WO2020/053485
PCT Pub. Date: Mar. 19, 2020

(65) Prior Publication Data
US 2022/0048761 A1    Feb. 17, 2022

(30) Foreign Application Priority Data

Sep. 14, 2018   (FI) ..................................... 20185764

(51) Int. Cl.
*B81B 7/02*  (2006.01)
*B81C 1/00*  (2006.01)
(Continued)

(52) U.S. Cl.
CPC ............ *B81B 7/02* (2013.01); *B81C 1/00158* (2013.01); *G01L 9/0055* (2013.01);
(Continued)

(58) Field of Classification Search
None
See application file for complete search history.

(56) References Cited

U.S. PATENT DOCUMENTS 5,394,343 A    2/1995  Tsao
6,029,524 A    2/2000  Klauder et al.
(Continued)

FOREIGN PATENT DOCUMENTS

CN    1354823 A    6/2002
CN    101184978 A   5/2008
(Continued)

OTHER PUBLICATIONS

Messner et al: 3-way silicon microvalve for pneumatic applications with electrostatic actuation principle. Microfluidics Ano Nanofluidics, Mar. 1, 2006, vol. 2, No. 2, pp. 89-96.
(Continued)

*Primary Examiner* — Peter J Macchiarolo
*Assistant Examiner* — Jermaine L Jenkins
(74) *Attorney, Agent, or Firm* — Laine IP Oy

(57) ABSTRACT

According to an example aspect of the present invention, there is provided a MEMS pressure sensor, comprising: a sensor portion comprising a deformable membrane and a first volume, and a valve portion comprising a first output to a first side of the pressure sensor and a second output to a second side of the pressure sensor. The valve portion is operable to close the second output and open the first output to equalize pressure in the first volume with pressure at the first side of the pressure sensor for calibrating the sensor; and close the first output and open the second output to
(Continued)

equalize pressure in the first volume with pressure at the second side of the pressure sensor for pressure measurement.

21 Claims, 6 Drawing Sheets

(51) Int. Cl.
    *G01L 9/00*     (2006.01)
    *G01L 13/02*     (2006.01)

(52) U.S. Cl.
    CPC .... *G01L 13/025* (2013.01); *B81B 2201/0264* (2013.01); *B81B 2203/0127* (2013.01)

(56) References Cited

U.S. PATENT DOCUMENTS

| | | | |
|---|---|---|---|
| 6,418,793 | B1 | 7/2002 | Pechoux et al. |
| 7,043,960 | B1 | 5/2006 | Lueck |
| 9,772,245 | B2 * | 9/2017 | Besling ................ G01L 9/0045 |
| 2007/0008377 | A1 * | 1/2007 | Jia ........................... B41J 2/055 |
| | | | 347/54 |
| 2007/0023719 | A1 | 2/2007 | Shannon et al. |
| 2007/0277616 | A1 | 12/2007 | Nikkel et al. |
| 2009/0266180 | A1 | 10/2009 | Jiang |
| 2013/0092260 | A1 | 4/2013 | Jilderos |
| 2014/0060146 | A1 | 3/2014 | Zoellin et al. |
| 2014/0158215 | A1 | 6/2014 | Maichl et al. |
| 2014/0298884 | A1 * | 10/2014 | Mindlin .................. G01L 27/00 |
| | | | 29/428 |
| 2016/0069764 | A1 | 3/2016 | Plöchinger |
| 2017/0160155 | A1 * | 6/2017 | Nguyen ................ G01L 9/065 |
| 2017/0328800 | A1 * | 11/2017 | Li ........................ G01L 9/0054 |
| 2018/0058963 | A1 * | 3/2018 | Wagner .................. G01L 19/14 |
| 2018/0105417 | A1 * | 4/2018 | Seddon ................ G01L 9/0055 |

FOREIGN PATENT DOCUMENTS

| | | |
|---|---|---|
| CN | 101263077 A | 9/2008 |
| CN | 103620360 A | 3/2014 |
| CN | 104807148 A | 7/2015 |
| CN | 105102951 A | 11/2015 |
| CN | 105203258 A | 12/2015 |
| CN | 204964093 U | 1/2016 |
| CN | 107782485 A | 3/2018 |
| CN | 107850505 A | 3/2018 |
| CN | 108072487 A | 5/2018 |
| CN | 207515952 U | 6/2018 |
| DE | 3621331 A1 | 1/1988 |
| EP | 2520917 A1 | 11/2012 |
| EP | 3229002 A1 | 10/2017 |
| EP | 3287758 A1 | 2/2018 |
| JP | S6325524 A | 3/1988 |
| JP | H0669519 A | 3/1994 |
| JP | 2006207780 A | 8/2006 |
| JP | 2015111055 A | 6/2015 |
| KR | 20110082087 A | 7/2011 |
| WO | WO03058187 A1 | 7/2003 |
| WO | WO2006042357 A1 | 4/2006 |
| WO | WO2016203106 A1 | 12/2016 |

OTHER PUBLICATIONS

Takao et al: A MEMS microvalve with PDMS diaphragm and two-chamber configuration of thermo-pneumatic actuator for integrated blood test system on silicon. Sensors and Actuators A 119, 2005, pp. 468-475.

Xin: Novel biosensors and their applications in related biophysical studies. University of Science and Technology of China, Feb. 15, 2017.

* cited by examiner

MICROELECTROMECHANICAL CAPACITIVE PRESSURE SENSOR HAVING A VALVE PORTION BEING OPERABLE TO CLOSE FIRST OUTPUT AND OPEN SECOND OUTPUT TO EQUALIZE PRESSURE

FIELD

The present invention relates to pressure sensors. In particular, the present invention relates to micro-electromechanical (MEMS) pressure sensors.

BACKGROUND

MEMS technology facilitates the manufacture of compact pressure sensors, such as piezoresistive pressure sensors. A piezoresistive sensor may comprise piezoresistive detection elements on a deformable membrane. Geometrical change of the deformable member caused by pressure causes change of resistivity detected in the sensor.

A MEMS capacitive pressure sensor requires two electrodes that move relative to each other under an applied pressure. This configuration is often accomplished by having a fixed electrode formed on a substrate while a moveable electrode is provided in a deformable membrane which is exposed to pressure that is to be sensed.

WO2016203106 discloses a MEMS capacitive pressure sensor, comprising a first electrode, a deformable second electrode being electrically insulated from the first electrode by means of a chamber between the first electrode and the second electrode. At least one of the first electrode and the second electrode includes at least one pedestal protruding into the chamber. There is also provided a method for manufacturing a MEMS capacitive pressure sensor.

Pressure sensors are susceptible to drifting over time. External valves are applied to offset drift of a differential pressure sensor.

SUMMARY OF THE INVENTION

According to some aspects, there is provided the subject-matter of the independent claims. Some embodiments are defined in the dependent claims.

According to a first aspect of the present invention, there is provided a MEMS pressure sensor, comprising: a sensor portion comprising a deformable membrane and a first volume, and a valve portion comprising a first output to a first side of the pressure sensor and a second output to a second side of the pressure sensor. The valve portion is operable to close the second output and open the first output to equalize pressure in the first volume with pressure at the first side of the pressure sensor for calibrating the pressure sensor; and close the first output and open the second output to equalize pressure in the first volume with pressure at the second side of the pressure sensor for pressure measurement.

According to a second aspect of the present invention, there is provided a method for operating the MEMS pressure sensor according to the first aspect, comprising:
 directing opening of the first output of the sensor and closing the second output of the pressure sensor for equalizing pressure in the first volume with pressure at the first side of the pressure sensor,
 receiving a first signal indicative of capacitance or resistance change associated with the deformable membrane of the pressure sensor after opening the first output and closing the second output,
 performing sensor calibration on the basis of the received first signal,
 directing closing the first output and opening the second output after the sensor calibration for equalizing pressure in the first volume with pressure at the second side of the pressure sensor,
 receiving a second signal indicative of capacitance or resistance change associated with the deformable membrane after closing the first output and opening the second output; and
 determining pressure difference of the first side and the second side of the pressure sensor on the basis of the received second signal.

According to an embodiment, the valve portion comprises a second volume connected to the first volume, a first membrane comprising the first output, a second membrane comprising at least part of the second output, and a third membrane positioned in the second volume and between the first membrane and the second membrane, wherein the third membrane is adjustable to close the first output for the pressure measurement and the third membrane is adjustable to close the second output for offset nulling.

According to an embodiment, the sensor is configured to adjust the third membrane to close the first output by applying a first voltage between the first membrane and the third membrane and the sensor is configured to adjust the third membrane to close the second output by applying a second voltage between the second membrane and the third membrane.

According to an embodiment, the pressure sensor is a capacitive pressure sensor and comprises a first electrode in the first volume and a second electrode forming or comprising the deformable membrane.

According to an embodiment, the pressure sensor is configured for or comprises means for providing a first signal indicative of capacitance or resistance change associated with the deformable membrane of the pressure sensor after opening the first output and closing the second output and a second signal indicative of capacitance or resistance change associated with the deformable membrane after closing the first output and opening the second output.

EMBODIMENTS

A MEMS pressure sensor apparatus or device is now provided, in which an integrated valve arrangement has been developed to address drifting of the sensor. The size of the valve has been miniaturized into MEMS scale, thus enabling to decrease also the cost associated with the drifting compensation significantly. The valve may also be referred to as an integrated MEMS valve and used together with a MEMS pressure sensor portion for compensating drifting and null point calibration.

Figure 1:
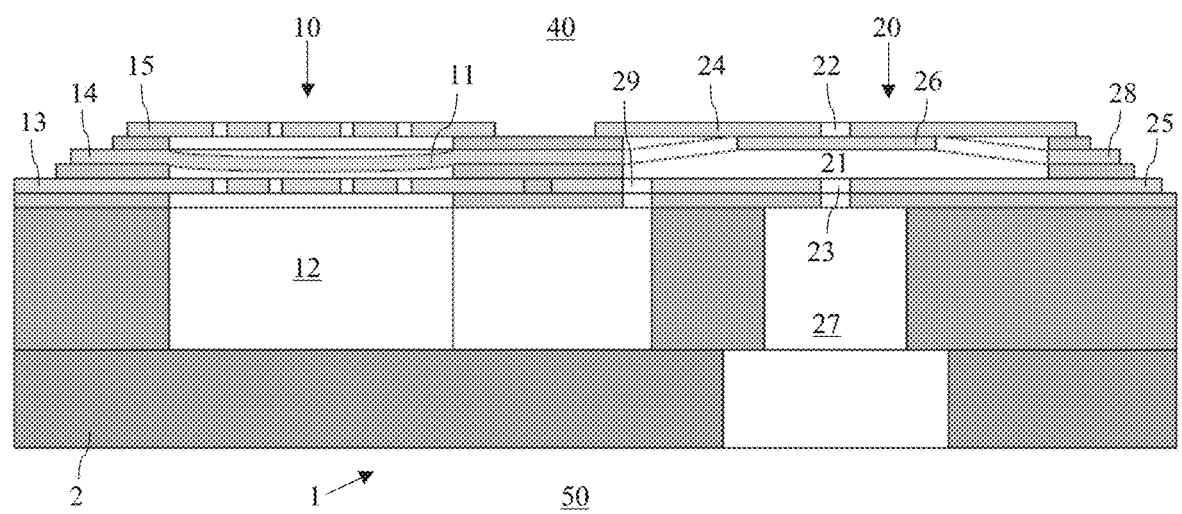
FIGS. 1 and 2 illustrate sectional or side views of a MEMS pressure sensor in accordance with at least some embodiments of the present invention.

FIG. 1 illustrates a simplified example of such MEMS pressure sensor device 1. The sensor device 1 comprises a sensor portion 10 comprising a deformable membrane 11 and a first volume 12. The sensor device further comprises a valve arrangement or portion 20 comprising a second volume 21 connected via a channel 29 to the first volume, a first output 22 to one side 40 of the pressure sensor, and a second output 23 to another side 50 of the pressure sensor.

The valve portion 20 may comprise a first membrane 24 comprising the first output 22, a second membrane 25 comprising at least part of the second output 23, and a third membrane 26 positioned in the second volume 21 and between the first membrane and the second membrane. For example, the third membrane may be spring-mounted to further portion of an intermediate layer 28. The layer 28 may continue to the sensor portion 10 and may comprise the deformable membrane 11. The valve portion 20 may further comprise a third volume 27 connected to or comprised by the second output 23.

The sensor 1 also includes a first electrode 13 which may be fixedly attached to a substrate 2 directly or via one or more intermediate layers. The substrate 2 may be a standard silicon wafer. The substrate may further comprise semiconductor devices (not shown).

Figure 3:
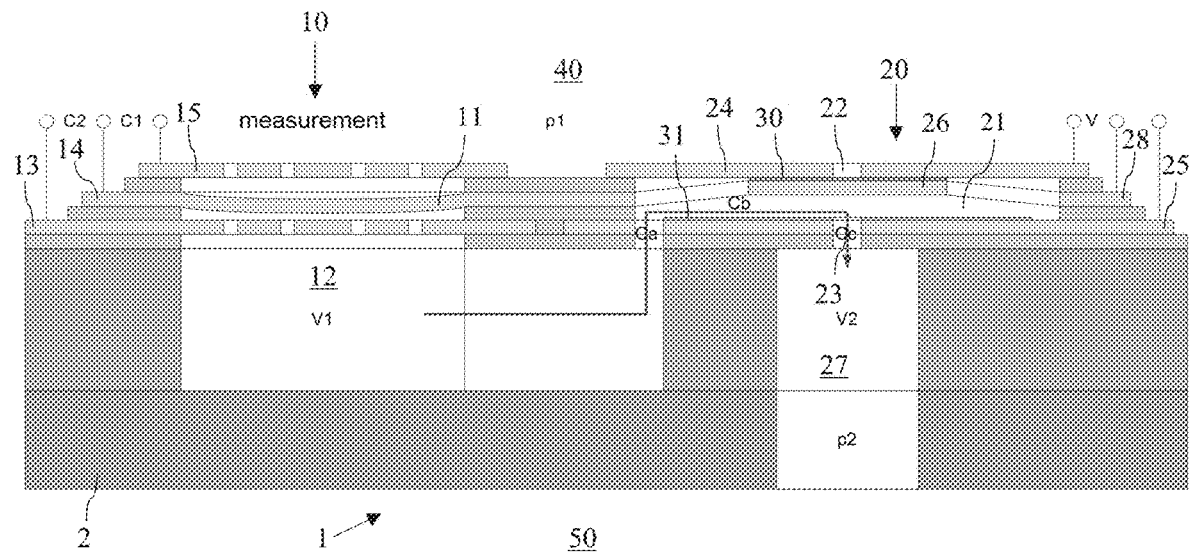
FIGS. 3 and 4 illustrate side views of a capacitive MEMS pressure sensor in accordance with at least some embodiments.

As illustrated in FIGS. 1 and 3, the third membrane 26 is adjustable to close the first output 22 and open the second output 23 for pressure measurement. Thus a channel is opened from volume 12 via the channel 29, second volume 21, the second output 23, and the third volume 27 to the other side 50 of the sensor device, allowing the pressure in the volume 12 to equalize with pressure p2. Such state of the valve portion and the sensor 1 may be referred to as a measurement mode. The pressure difference between the different sides 40, 50 of the pressure sensor 1 causes deflection of the deformable membrane 11. As further illustrated in FIGS. 3 and 4, the third membrane 26 is insulated from the first membrane 24 and the second membrane 25, e.g. by thin insulation films 30, 31 attached to the third membrane and/or the other membranes 24, 25.

The valve portion 20 may form an electrostatically actuated MEMS valve. In some embodiments, the sensor device 1 is configured to adjust the third membrane 26 to close the first output 22 by applying a first voltage between the first membrane 24 and the third membrane 26 (coupled to or forming part of the layer 28).

Figure 2:
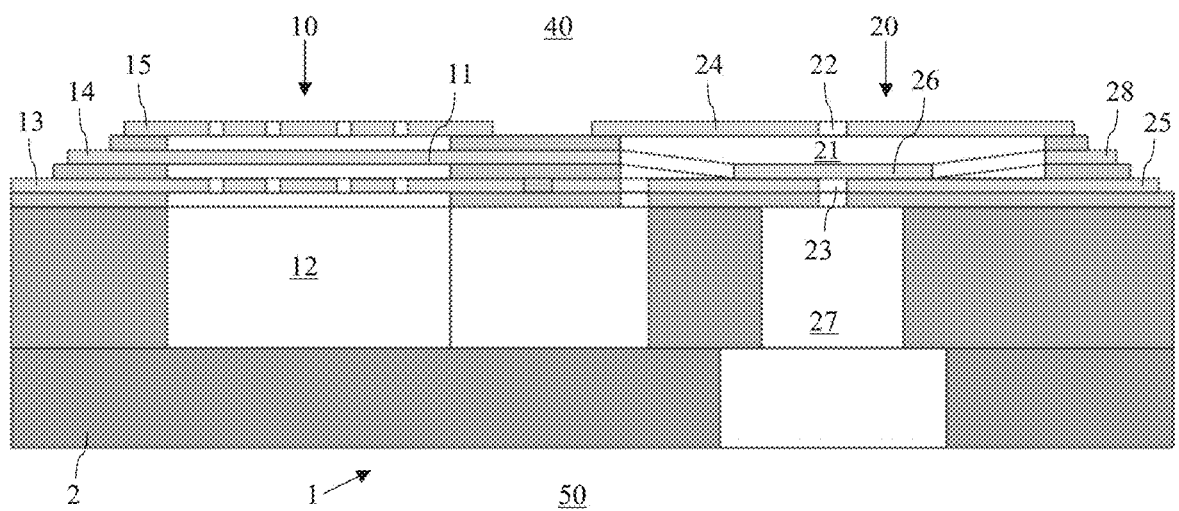
Figure 4:
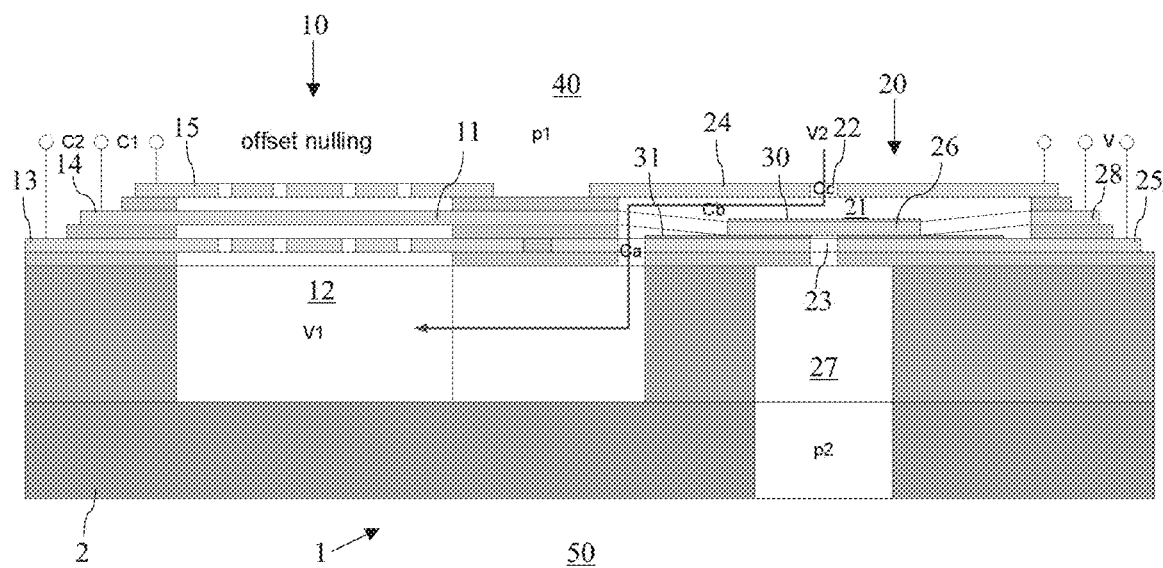

As illustrated in FIGS. 2 and 4, the third membrane 26 is adjustable to open the first output 22 and close the second output 23 for calibrating the sensor and offset nulling, herein referred to as a calibration mode. With reference to FIG. 4, when entering the calibration mode, pressure in the first volume V1 12 equalizes to pressure p1 in the first side 40 through a flow channel defined by conductances Ca, Cb, and Cc.

In some embodiments, the sensor device is configured to adjust the third membrane 26 to close the second output 23 by applying a second voltage between the second membrane 25 and the third membrane 26. Depending on the selected implementation, the first voltage may be equal to or different than the second voltage. In an alternative embodiment, the sensor device is configured such that voltage is applied only to switch to the measurement mode or to the calibration mode. The sensor device may be configured such that power is required only when the state of the valve portion 20 is changed. Power consumption required for the actuation is in mW range, maybe even in μW range, thus enabling substantial reduction as compared to applying conventional external (three-way) valves requiring electric power when the valve is maintained as actuated (in W range).

According to some embodiments, the pressure sensor 1 is a capacitive pressure sensor. With reference to the example of FIGS. 1 to 4, the capacitive sensor device 300, and the sensor portion 10 thereof, comprises a first electrode 13 in the first volume and a second electrode 14 forming or comprising the deformable membrane 11. The sensor device 300 further comprises a third electrode 15 configured to let the pressure at the first side 40 of the pressure sensor to affect the second electrode and thus the deformable membrane 11. The electrodes are electrically insulated from each other by insulating layers.

The pressure difference during the measurement mode illustrated in FIG. 3 is proportional to capacitance imbalance between a first capacitance C1 between the second electrode 14 and the third electrode 15 and a second capacitance C2 between the second electrode 14 and the first electrode 13. Thus, the pressure difference p1-p2 may be derived on the basis of capacitance imbalance C1-C2 or C1/C2.

Figure 5:
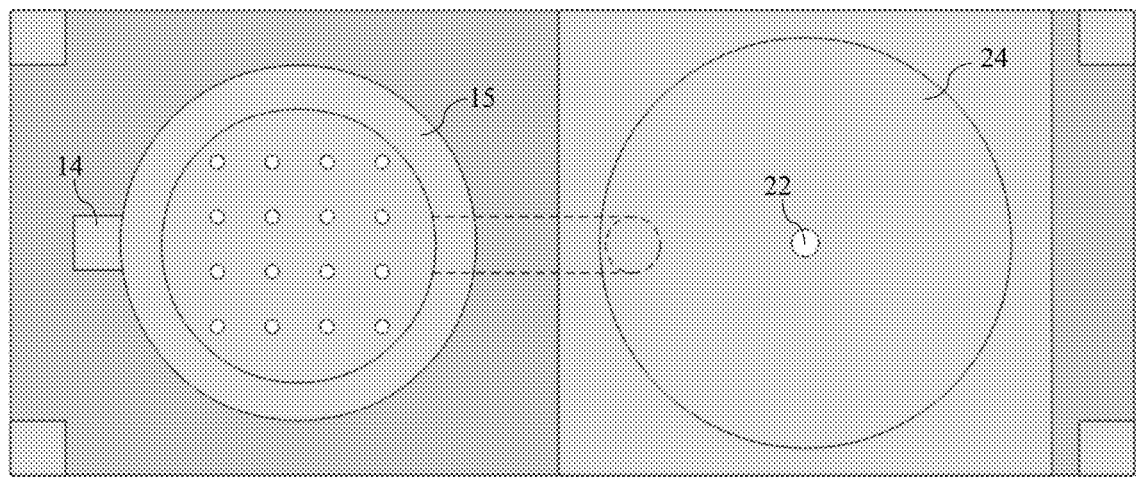
FIG. 5 illustrates a top view of a capacitive MEMS pressure sensor in accordance with at least some embodiments.

FIG. 5 illustrates an example top view of the capacitive pressure sensor 1.

In some embodiments, the pressure sensor is a piezoresistive pressure sensor. The sensor may thus comprise at least one piezoresistive detection element on the deformable membrane, or comprising the deformable membrane. The piezoresistive detection element may comprise a thin conductive diaphragm embedded between insulating layers. For example, the diaphragm may be of single crystal or polycrystalline silicon. The diaphragm is stretched when external pressure is applied over it in the measurement mode. The geometrical change (compression or stretching) causes change of resistivity in the diaphragm. The piezoresistive pressure sensor is configured to detect the resistance change in the diaphragm and provide a signal for pressure measurement on the basis of the resistance change.

Figure 6:
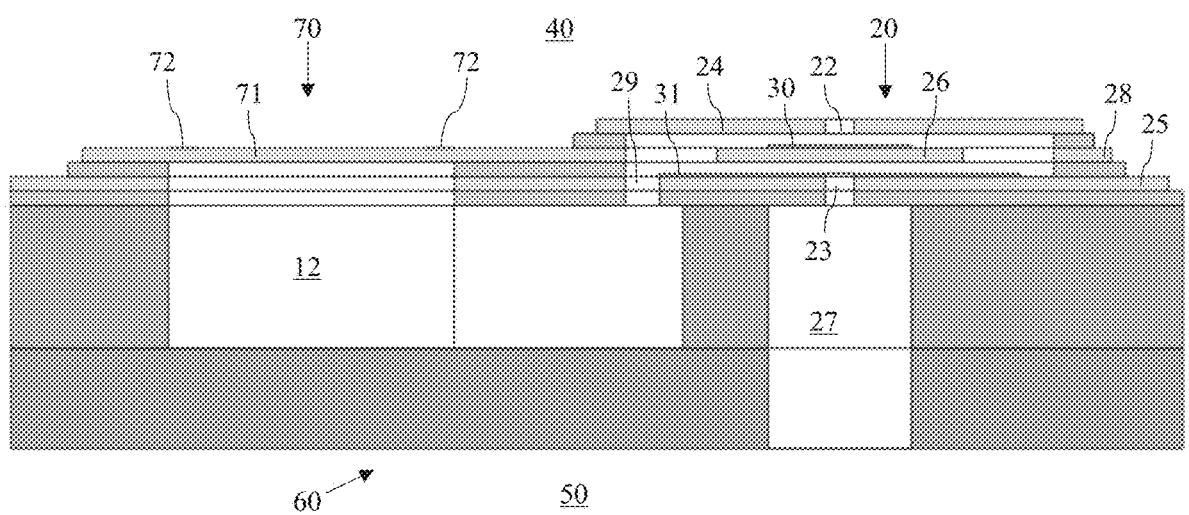
FIG. 6 illustrates a side view of a piezoresistive MEMS pressure sensor in accordance with at least some embodiments.
Figure 7:
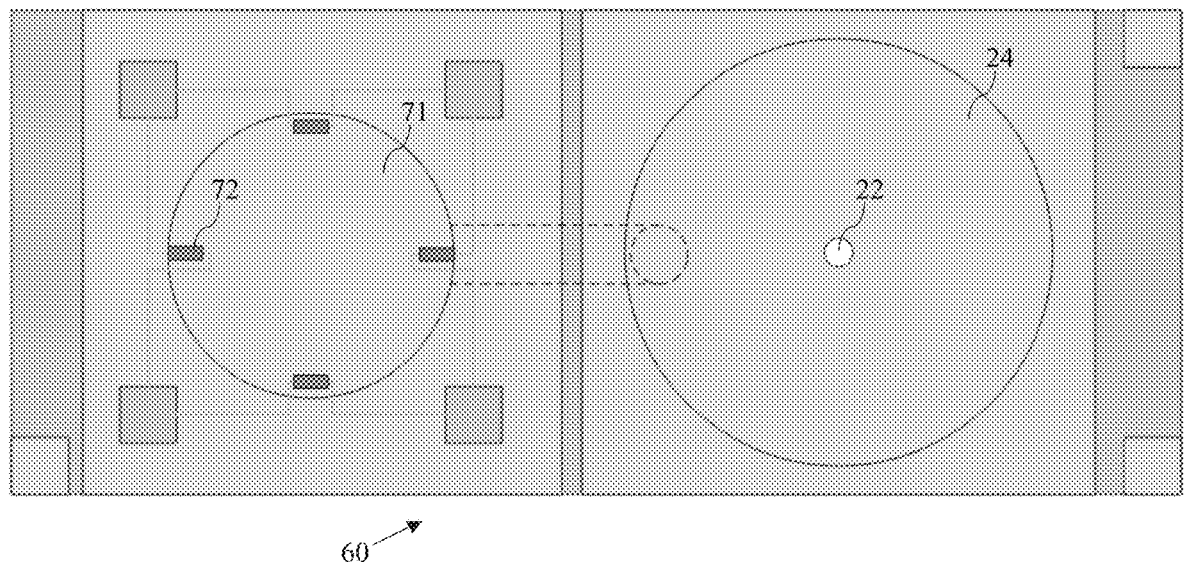
FIG. 7 illustrates a top view of a piezoresistive MEMS pressure sensor in accordance with at least some embodiments.
Figure 8:
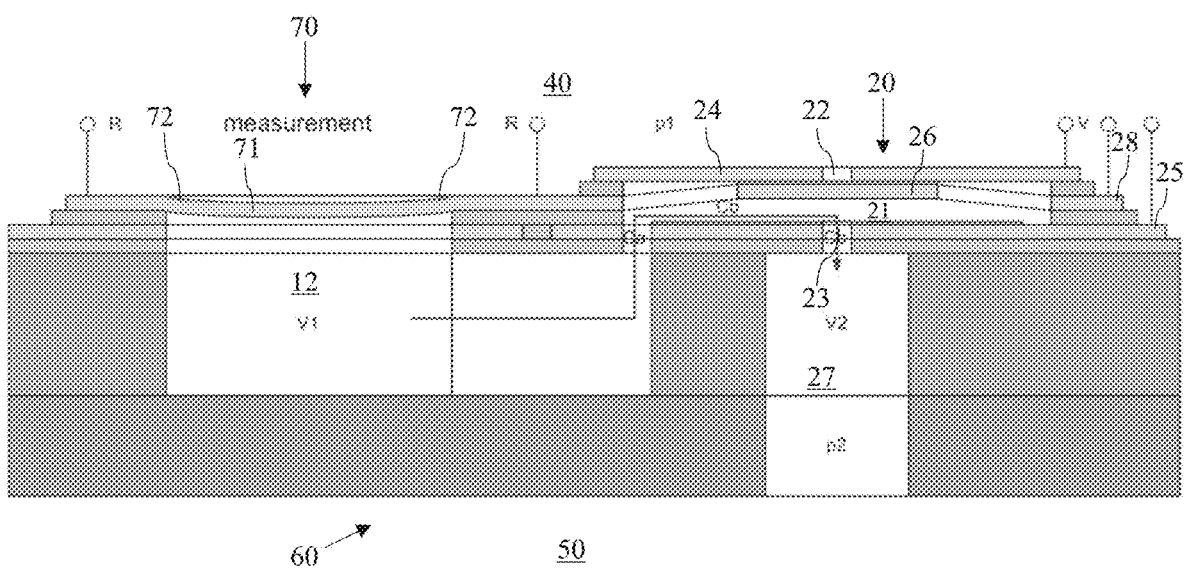
FIGS. 8 and 9 illustrate side views of a piezoresistive MEMS pressure sensor in accordance with at least some embodiments.
Figure 9:
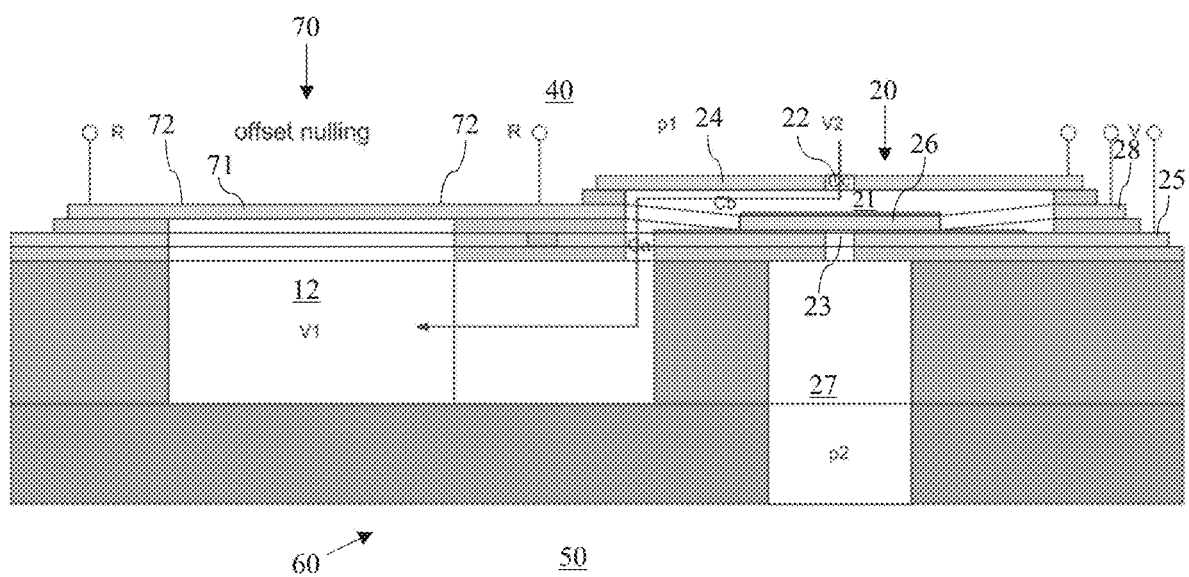

Some examples of such piezoresistive pressure sensor are provided in FIGS. 6 to 9. FIG. 7 illustrates example top view of the piezoresistive pressure sensor 60. FIGS. 8 and 9 illustrate measurement and calibration modes of the pressure sensor 60, respectively.

The sensor 60 comprises a valve arrangement or portion, which may comprise similar elements and operate similarly as the valve portion 20 illustrated above. As illustrated in FIG. 6, in some embodiments the valve portion may be set in a specific third intermediate position, which may serve as a rest position/mode. However, in other embodiments the valve portion may be provided with two positions and modes, one of which may serve as a rest position (not requiring input power).

The sensor 60 comprises a sensor portion 70 configured for piezoresistive pressure measurement. The sensor portion 70 comprises comprising a deformable membrane 71 and a set of piezoresistors 72 on the deformable membrane 71. The set of piezoresistors 72 is configured to provide a signal indicative of change of resistivity upon closing the first output 22 and opening the second output 23. The pressure difference in the measurement mode is proportional to resistance change due the bending of the deformation member 71 in the piezoresistive pressure sensor 60, as sensed by the piezoresistors 72 thereof. The sensor may thus be configured to output a signal indicative of pressure difference between the first volume 12 and the third volume 27. The piezoresistive pressure sensor may be calibrated by the valve portion 20 as illustrated above and in FIG. 9. A signal conditioning circuit may be applied for temperature compensation.

Various advantages are available by the presently disclosed MEMS sensor with integrated calibration valve arrangement. The size and power consumption of the overall sensor arrangement with drifting compensation can be substantially reduced. Since external valves can be avoided, associated interfaces and tubes can be avoided. Since the distances are shorter, the gas change and calibration is faster. Also overall production costs may be reduced by integrated manufacturing of the sensor portion 10, 70 and valve portion 20.

Some example application areas for the presently disclosed MEMS sensor with integrated calibration valve arrangement include building automation and medical devices, such as differential pressure transmitters for heating, ventilation and air conditioning systems (HVAC) and respiration analyzers.

It is to be appreciated that FIGS. 1 to 9 illustrate only some sensor device examples and various modifications and additions may be made in the structure. It will be appreciated that form and positioning of sensor device elements, such as connection(s) between the volumes and/or the number and positioning of the outputs may be changed in many ways, as appropriate for the application in question.

According to some embodiments, there is provided an apparatus comprising and/or controlling the MEMS sensor device 1, 60 according to any of the above illustrated embodiments. The apparatus further comprises a control circuitry configured to control the MEMS sensor device, such as cause closing the first output and the second output and detect the pressure difference between the first volume and the third volume. In some embodiments, the circuitry comprises one or more application-specific integrated circuits (ASIC) or field-programmable gate arrays (FPGA). The apparatus may comprise a control device configured to control the MEMS sensor device 1, 60 and receive signals from the sensor device for pressure measurement.

An electronic device comprising electronic circuitries may be configured to operate as the control device to control the MEMS sensor device 1, 60 according to at least some embodiments. In some embodiments, the apparatus carrying out at least some of the above-described functionalities is comprised in such a device, e.g. the apparatus may comprise circuitry, such as a chip, a chipset, a microcontroller, or a combination of circuitries for or in any one of the above-described devices. The circuitry may refer to use of hardware-only circuit implementation or combination(s) of hardware circuits and software implementation. The device may comprise a processor and memory at least in part accessible to the processor. The memory may comprise computer instructions that the processor is configured to execute. The memory, processor and computer program code may thus be configured to cause the device to perform at least some of the presently disclosed features. It will be appreciated that the device may comprise various further elements, such as a transmitter for transmitting measurement results, a receiver, and a user interface.

Figure 10:
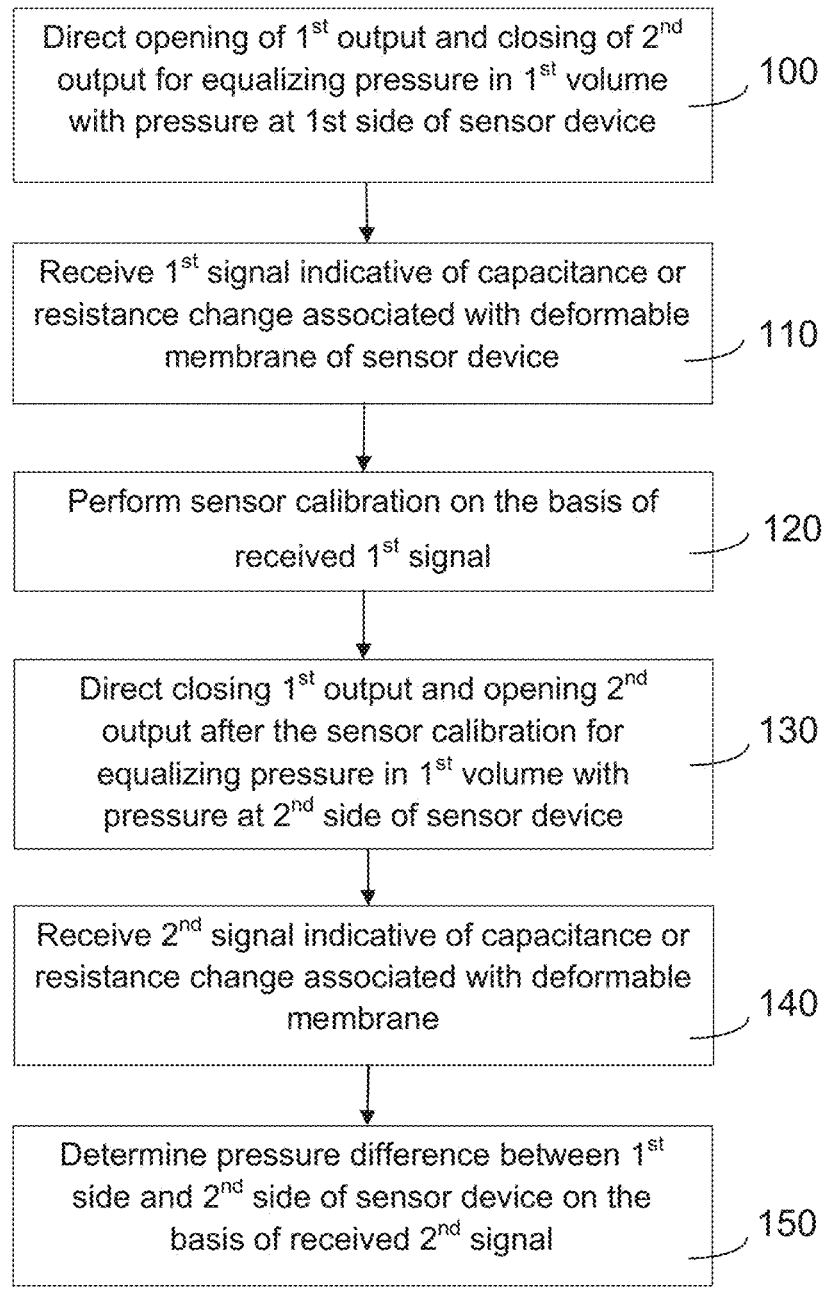
FIG. 10 is a flow graph of a method in accordance with at least some embodiments of the present invention.

With reference to FIG. 10, according to an aspect, there is provided a method for operating the MEMS pressure sensor device according to at least some of the above illustrated embodiments. The method may be applied for measuring pressure by applying the sensor device 1 or 60 by an apparatus comprising or controlling the MEMS sensor device 1, 60. The method comprises:

directing 100 opening of the first output 22 and closing the second output 23 of the sensor device for equalizing pressure in the first volume 12 with pressure at the first side 40 of the sensor device, receiving 110 a first signal indicative of capacitance or resistance change associated with the deformable membrane 11, 71 of the sensor device after opening the first output and closing the second output 23, performing 120 sensor calibration on the basis of the received first signal, directing 130 closing the first output 22 and opening the second output 23 after the sensor calibration for equalizing pressure in the first volume 12 with pressure at the second side (50) of the sensor device, receiving 140 a second signal indicative of capacitance or resistance change associated with the deformable membrane 11, 71 after closing the first output 22 and opening the second output 23; and determining 150 pressure difference between the first side 40 and the second side 50 of the sensor device on the basis of the received second signal.

A MEMS pressure sensor 1, 60 with the integrated valve arrangement may be fabricated, for example, by applying at least some features of the fabrication process illustrated below. The fabrication process is based on micromechanical polycrystalline silicon deposition and sacrificial etching of supporting oxide layers. Sacrificial etching means that silicon oxide layers between and below polycrystalline membranes are partially removed during the process to release membranes and form free-standing structures. Main benefits of applying polycrystalline silicon include uniformity of deposition process, adaptable tensile stress, electrical conductivity and chemical selectivity against silicon dioxide during sacrificial etching.

In case of the capacitive sensor device 1, the pressure sensing element may be constructed of two free-standing, overlapping air-gap capacitors manufactured on thin DSP silicon wafers. The capacitors are constructed of the bending diaphragm 11, open to external air pressure and two static, perforated electrodes 13, 15 below and on top of the diaphragm. Pressure difference causes bending of the diaphragm, and thus varies the capacitances proportional to pressure difference.

The diaphragm and the electrodes may be deposited of thin micromechanical polycrystalline silicon. Three dielectric, silicon oxide layers support the polysilicon membranes and act as electrical insulators between diaphragm and electrodes. The support area of the static electrodes is minimized to keep parasitic capacitance low. The backside of the silicon substrate is DRIE (Deep Reactive Ion Etching) etched to release the bottom electrode.

Hydrogen fluoride vapor may be applied used to remove partially supporting silicon oxide layers, simultaneously on both sides. Geometry of the capacitor cavity is defined during the sacrificial etching process through lithographically defined openings in static electrodes. Electrical connections are formed using aluminum metallization over subsequently opened contact openings. Top surface is passivated using silicon oxide and nitride layers.

Two-way and three-way electrostatically actuated MEMS valve portions 20 may be fabricated with same manufacturing process as pressure sensors. The structure of the valves is very similar than the pressure sensor portion 10 including two static electrodes and electrostatically actuated membrane between them.

It is to be understood that the embodiments of the invention disclosed are not limited to the particular structures, process steps, or materials disclosed herein, but are extended to equivalents thereof as would be recognized by those ordinarily skilled in the relevant arts. It should also be understood that terminology employed herein is used for the purpose of describing particular embodiments only and is not intended to be limiting.

Reference throughout this specification to one embodiment or an embodiment means that a particular feature, structure, or characteristic described in connection with the embodiment is included in at least one embodiment of the present invention. Thus, appearances of the phrases "in one embodiment" or "in an embodiment" in various places throughout this specification are not necessarily all referring to the same embodiment. Where reference is made to a numerical value using a term such as, for example, about or substantially, the exact numerical value is also disclosed.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary. In addition, various embodiments and example of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the preceding description, numerous specific details are provided, such as examples of lengths, widths, shapes, etc., to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

While the forgoing examples are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

The verbs "to comprise" and "to include" are used in this document as open limitations that neither exclude nor require the existence of also un-recited features. The features recited in depending claims are mutually freely combinable unless otherwise explicitly stated. Furthermore, it is to be understood that the use of "a" or "an", that is, a singular form, throughout this document does not exclude a plurality.

INDUSTRIAL APPLICABILITY

At least some embodiments of the present invention find industrial application in pressure sensors.

ACRONYMS LIST

ASIC Application-specific integrated circuit
DRIE Deep reactive ion etching
FPGA Field-programmable gate array
HVAC Heating, ventilation and air conditioning system
MEMS Micro-electro-mechanical sensor

The invention claimed is:

1. A MEMS pressure sensor, comprising:
a sensor portion comprising a deformable membrane and a first volume, and
a valve portion comprising a first output to a first side of the pressure sensor and a second output to a second side of the pressure sensor, wherein the valve portion is operable to:
close the second output and open the first output to equalize pressure in the first volume with pressure at the first side of the pressure sensor for calibrating the pressure sensor; and
close the first output and open the second output to equalize pressure in the first volume with pressure at the second side of the pressure sensor for pressure measurement,
wherein the pressure sensor is configured to provide a first signal indicative of capacitance or resistance change associated with the deformable membrane of the pressure sensor after opening the first output and closing the second output and to provide a second signal indicative of capacitance or resistance change associated with the deformable membrane after closing the first output and opening the second output.

2. The MEMS pressure sensor according to claim 1, wherein the valve portion comprises a second volume connected to the first volume, a first membrane comprising the first output, a second membrane comprising at least part of the second output, and a third membrane positioned in the second volume and between the first membrane and the second membrane, wherein the third membrane is adjustable to close the first output for the pressure measurement and the third membrane is adjustable to close the second output for offset nulling.

3. The MEMS pressure sensor according to claim 2, wherein the pressure sensor is configured to adjust the third membrane to close the first output by applying a first voltage between the first membrane and the third membrane and the pressure sensor is configured to adjust the third membrane to close the second output by applying a second voltage between the second membrane and the third membrane.

4. The MEMS pressure sensor according to claim 3, wherein the pressure sensor is a capacitive pressure sensor and comprises a first electrode in the first volume and a second electrode forming or comprising the deformable membrane.

5. The MEMS pressure sensor according to claim 4, further comprising a third electrode, wherein the electrodes are electrically insulated from each other, the second electrode is positioned between the first electrode and the third electrode, and the third electrode is configured to let the pressure at the first side of the pressure sensor to affect the deformable membrane.

6. The MEMS pressure sensor according to claim 2, wherein the pressure sensor is a capacitive pressure sensor and comprises a first electrode in the first volume and a second electrode forming or comprising the deformable membrane.

7. The MEMS pressure sensor according to claim 6, further comprising a third electrode, wherein the electrodes are electrically insulated from each other, the second electrode is positioned between the first electrode and the third electrode, and the third electrode is configured to let the pressure at the first side of the pressure sensor to affect the deformable membrane.

8. The MEMS pressure sensor according to claim 2, wherein the pressure sensor is a piezoresistive pressure sensor and comprises at least one piezoresistive diaphragm on the deformable membrane or comprising the deformable membrane.

9. The MEMS pressure sensor according to claim 1, wherein the pressure sensor is a capacitive pressure sensor and comprises a first electrode in the first volume and a second electrode forming or comprising the deformable membrane.

10. The MEMS pressure sensor according to claim 9, further comprising a third electrode, wherein the electrodes are electrically insulated from each other, the second electrode is positioned between the first electrode and the third electrode, and the third electrode is configured to let the pressure at the first side of the pressure sensor to affect the deformable membrane.

11. The MEMS pressure sensor according to claim 10, wherein the pressure sensor is configured for detecting pressure difference during the pressure measurement on the basis of capacitance imbalance between a first capacitance between the second electrode and the third electrode and a second capacitance between the second electrode and the first electrode.

12. The MEMS pressure sensor according to claim 1, wherein the pressure sensor is a piezoresistive pressure sensor and comprises at least one piezoresistive diaphragm on the deformable membrane or comprising the deformable membrane.

13. The MEMS pressure sensor according to claim 12, wherein the piezoresistive membrane comprises a set of piezoresistors on the deformable membrane, the set of piezoresistors being configured to provide the second signal indicative of change of resistivity upon closing the first output and opening the second output.

14. An apparatus, comprising a MEMS pressure sensor according to claim 1 and control circuitry configured to cause closing the first output and the second output and detecting the pressure difference between the first side and the second side of the pressure sensor.

15. The apparatus of claim 14, wherein the valve portion of the MEMS pressure sensor comprises a second volume connected to the first volume, a first membrane comprising the first output, a second membrane comprising at least part of the second output, and a third membrane positioned in the second volume and between the first membrane and the second membrane, wherein the third membrane is adjustable to close the first output for the pressure measurement and the third membrane is adjustable to close the second output for offset nulling.

16. The apparatus of claim 15, wherein the MEMS pressure sensor is configured to adjust the third membrane to close the first output by applying a first voltage between the first membrane and the third membrane and the pressure sensor is configured to adjust the third membrane to close the second output by applying a second voltage between the second membrane and the third membrane.

17. A method for operating a MEMS pressure sensor according to claim 1, comprising:
directing opening of the first output of the pressure sensor and closing the second output of the pressure sensor for equalizing pressure in the first volume with pressure at the first side of the pressure sensor,
receiving the first signal indicative of capacitance or resistance change associated with the deformable membrane of the pressure sensor after opening the first output and closing the second output,
performing sensor calibration on the basis of the received first signal,
directing closing the first output and opening the second output after the sensor calibration for equalizing pressure in the first volume with pressure at the second side of the pressure sensor,
receiving the second signal indicative of capacitance or resistance change associated with the deformable membrane after closing the first output and opening the second output; and
determining pressure difference between the first side and the second side of the pressure sensor on the basis of the received second signal.

18. The method according to claim 17, wherein the valve portion of the pressure sensor comprises a second volume connected to the first volume, a first membrane comprising the first output, a second membrane comprising at least part of the second output, and a third membrane positioned in the second volume and between the first membrane and the second membrane, wherein the third membrane is adjustable to close the first output for the pressure measurement and the third membrane is adjustable to close the second output for offset nulling, and wherein the third membrane is directed to close the first output for the pressure measurement and close the second output for offset nulling.

19. The method according to claim 18, wherein the third membrane is directed to close the first output by applying a first voltage between the first membrane and the third membrane and the third membrane is directed to close the second output by applying a second voltage between the second membrane and the third membrane.

20. A MEMS pressure sensor apparatus, comprising:
a sensor portion comprising a deformable membrane and a first volume, and
a valve portion comprising a first output to a first side of the pressure sensor and a second output to a second side of the pressure sensor, wherein the valve portion is operable to:
close the second output and open the first output to equalize pressure in the first volume with pressure at the first side of the pressure sensor for calibrating the pressure sensor; and
close the first output and open the second output to equalize pressure in the first volume with pressure at the second side of the pressure sensor for pressure measurement,
wherein the valve portion comprises a second volume connected to the first volume, a first membrane comprising the first output, a second membrane comprising at least part of the second output, and a third membrane positioned in the second volume and between the first membrane and the second membrane, wherein the third membrane is adjustable to close the first output for the pressure measurement and the third membrane is adjustable to close the second output for offset nulling.

21. A MEMS pressure sensor apparatus, comprising:
a sensor portion comprising a deformable membrane and a first volume, and a valve portion comprising a first output to a first side of the pressure sensor and a second output to a second side of the pressure sensor, wherein the valve portion is operable to:
   close the second output and open the first output to equalize pressure in the first volume with pressure at the first side of the pressure sensor for calibrating the pressure sensor; and
   close the first output and open the second output to equalize pressure in the first volume with pressure at the second side of the pressure sensor for pressure measurement,
wherein the pressure sensor is a capacitive pressure sensor and comprises a first electrode in the first volume, a second electrode forming or comprising the deformable membrane, and a third electrode, wherein the electrodes are electrically insulated from each other, the second electrode is positioned between the first electrode and the third electrode, and the third electrode is configured to let the pressure at the first side of the pressure sensor to affect the deformable membrane.

* * * * *